US009910938B2

(12) United States Patent
Morales German et al.

(10) Patent No.: US 9,910,938 B2
(45) Date of Patent: Mar. 6, 2018

(54) SHALE GAS PRODUCTION FORECASTING

(71) Applicant: Schlumberger Technology Corporation, Sugar Land, TX (US)

(72) Inventors: Gabriela Morales German, Mexico City (MX); Rafael Navarro Rosales, Lee (FR); Francois Xavier Dubost, Idron (FR)

(73) Assignee: Schlumberger Technology Corporation, Sugar Land, TX (US)

( * ) Notice: Subject to any disclaimer, the term of this patent is extended or adjusted under 35 U.S.C. 154(b) by 1210 days.

(21) Appl. No.: 13/918,249

(22) Filed: Jun. 14, 2013

(65) Prior Publication Data

US 2013/0346040 A1 Dec. 26, 2013

Related U.S. Application Data

(60) Provisional application No. 61/662,292, filed on Jun. 20, 2012.

(51) Int. Cl.

| | |
|---|---|
| ***G06F 17/50*** | (2006.01) |
| ***E21B 43/00*** | (2006.01) |
| ***G01V 99/00*** | (2009.01) |
| ***G01V 1/28*** | (2006.01) |

(52) U.S. Cl.

CPC .......... *G06F 17/5009* (2013.01); *E21B 43/00* (2013.01); *G01V 1/282* (2013.01); *G01V 99/005* (2013.01); *G01V 2210/61* (2013.01)

(58) Field of Classification Search

None

See application file for complete search history.

(56) References Cited

U.S. PATENT DOCUMENTS

| | | | | |
|---|---|---|---|---|
| 2009/0084545 A1* | 4/2009 | Banerjee | E21B 49/00 | 166/250.15 |
| 2011/0125476 A1* | 5/2011 | Craig | E21B 43/16 | 703/10 |
| 2012/0158378 A1* | 6/2012 | Enchery | G01V 11/00 | 703/2 |

OTHER PUBLICATIONS

Duong, Anh N. "Rate-decline analysis for fracture-dominated shale reservoirs." SPE Reservoir Evaluation & Engineering 14.03 (2011): 377-387.*

Frantz, Joseph H., et al. "Evaluating barnett shale production performance-using an integrated approach." SPE Annual Technical Conference and Exhibition. Society of Petroleum Engineers, 2005.*

(Continued)

*Primary Examiner* — Omar F Fernandez Rivas
*Assistant Examiner* — Bijan Mapar
(74) *Attorney, Agent, or Firm* — Colin L. Wier; Gary Gex; Alec McGinn

(57) ABSTRACT

A method can include providing data for at least one shale gas formation; performing a statistical analysis on the data for each of the at least one shale gas formation; providing a simulation model; history matching the simulation model for each of the at least one shale gas formation based at least in part on the performed statistical analysis to generate a history matched model for each of the at least one shale gas formation; and forecasting production for another shale gas formation by plugging in data for the other shale gas formation into each generated history matched model. Various other apparatuses, systems, methods, etc., are also disclosed.

18 Claims, 13 Drawing Sheets

(56) References Cited

OTHER PUBLICATIONS

Galvao, Mauricio, et al. "Probabilistic Reserves and Resources Estimation: A Methodology for Aggregating Probabilistic Petroleum Reserves and Resources." SPE/EAGE European Unconventional Resources Conference & Exhibition-From Potential to Production. Mar. 22, 2012.*

"A Dynamic Global Gas Market", Oilfield Review, Autumn 2003, pp. 4-7.

Arps, J.J. , "Analysis of Decline Curves", Transactions of the AIME, vol. 160 (1), Houston Meeting, May 1944, pp. 228-247.

Cipolla, et al., "Modeling Well Performance in Shale-Gas Reservoirs", SPE 125532—SPE/EAGE Reservoir Characterization and Simulation Conference, Abu Dhabi, UAE, Oct. 19-21, 2009, 16 pages.

Du, et al., "A Workflow for Integrated Barnett Shale Gas Reservoir Modeling and Simulation", SPE 122934—Latin American and Caribbean Petroleum Engineering Conference, Cartagena, Colombia, May 31-Jun. 3, 2009, 12 pages.

Javadpour, et al., "Nanoscale Gas Flow in Shale Gas Sediments", Journal of Canadian Petroleum Technology, vol. 46 (10), Oct. 2007, 7 pages.

Bybee, et al., "Proper Evaluation of Shale-Gas Reservoirs Leads to a More-Effective Hydraulic-Fracture Stimulation", Journal of Petroleum Technology, vol. 61, No. 7, Jul. 2009, pp. 59-61.

Lewis, et al., "New Evaluation Techniques for Gas Shale Reservoirs", Reservoir Symposium, Schlumberger, 2004, 11 pages.

Matthews, et al., "Stimulation of Gas Shales: They're All the Same—Right?", SPE 106070—SPE Hydraulic Fracturing Technology Conference, College Station, Texas, Jan. 29-31, 2007, 16 pages.

Valkó, Peter P., "Assigning Value to Stimulation in the Barnett Shale: A Simultaneous Analysis of 7000 Plus Production Histories and Well Completion Records", SPE 119369—SPE Hydraulic Fracturing Technology Conference, The Woodlands, Texas, Jan. 19-21, 2009, 20 pages.

Waters, et al., "Simultaneous Hydraulic Fracturing of Adjacent Horizontal Wells in the Woodford Shale", SPE 119635—SPE Hydraulic Fracturing Tech. Conf., The Woodlands, TX, Jan. 19-21, 2009, 22 pages.

Zhang, et al., "Sensitivity Studies of Horizontal Wells with Hydraulic Fractures in Shale Gas Reservoirs", IPTC 13338—International Petroleum Technology Conference, Doha, Qatar, Dec. 7-9, 2009, 9 pages.

Scotia Waterous, et al., "European Shale Gas Overview", Feb. 2010, 43 pages.

* cited by examiner

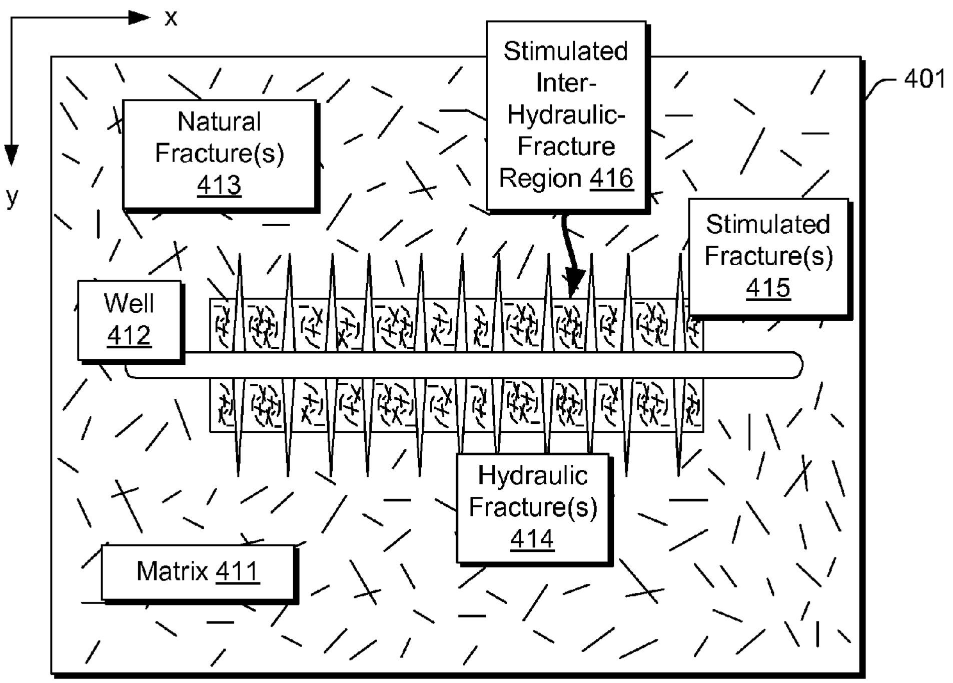
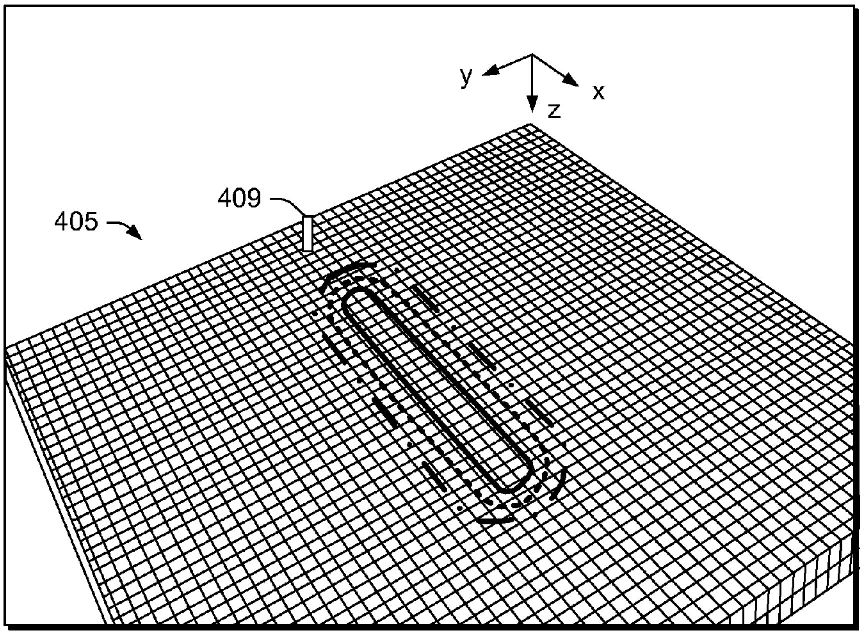
Fig. 4

Method 600

Gas shale basins identified with enough available production data per well for running a statistical analysis (e.g., >100 data points at a given time)
610

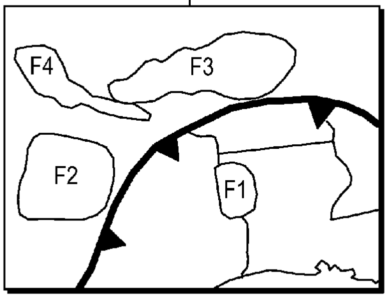

Retrieve core characteristics of the shale. Compiling a range of values:

(a) GIIP/section,
(b) Reservoir pressure,
(c) Net thickness,
(d) TOC,
(e) Ro,
(f) Horizontal section of the well,
(g) # of fracturing stages per well, and
(h) clusters per stage

620

Plot information retrieved through spider graphs to select the right analogue per basin.
630

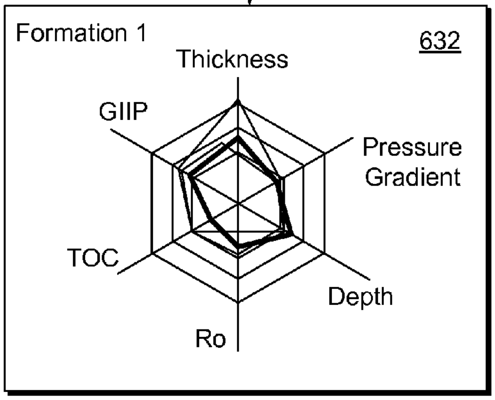

$$q_{g@sc} = \frac{k \cdot h\left(p_e{}^2 - p_{wf}{}^2\right)}{T \cdot \left(z \cdot \mu_g\right) \cdot \left(ln\left(\frac{r_e}{r_w}\right) + s + DQ_g\right)}$$ 634

Fig. 6

Method 600 (continued)
For the selected analogue, filter away non-representative well production data (e.g., old wells, horizontal lengths <500m, etc.) and normalize
640
Using the well production data from the selected analogue calculate a set of low, mid and high production trend cases (P10, P50 ,P90)
650
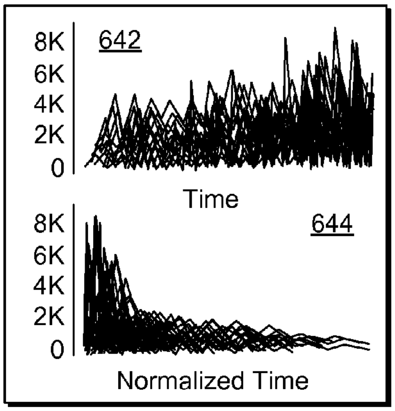
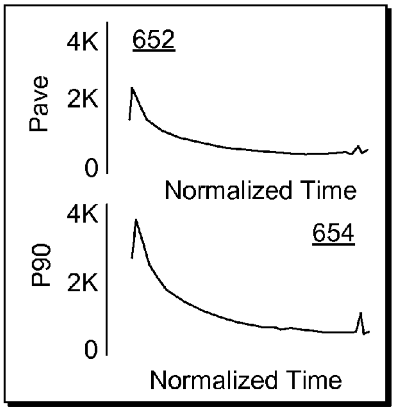
Match calculated production trend cases using different decline curves
660
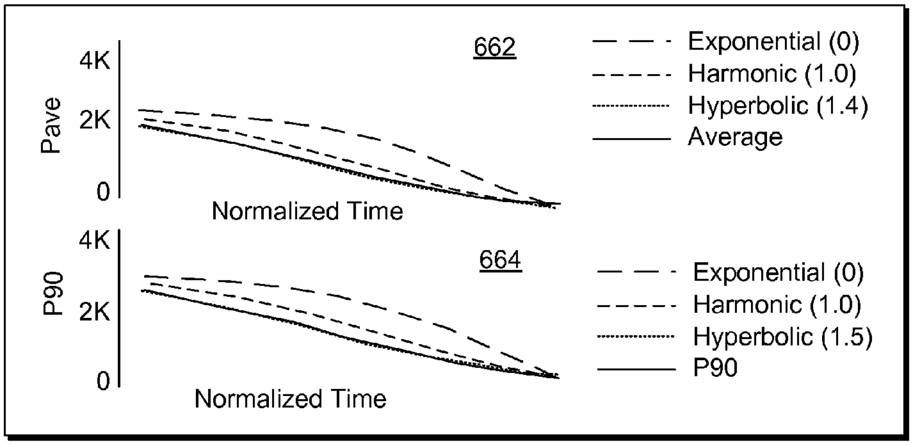
Fig. 7

Parameters 1130

| | F1 | F2 | F3 | F4 |
|---|---|---|---|---|
| **Layer thickness** | 270 | 116 | 190 | 200 |
| **Reservoir pressure** | 9883 | 4472 | 1919 | 4281 |
| **Formation Depth** | 11231 | 7710 | 4265 | 9514 |
| **Well length** | 3250 | 2950 | 3950 | 2950 |
| | | | | |
| ***Hydraulic fractures perm.*** | 15 | 5 | 4.5 | 4.5 |
| ***Hydraulic fracture length*** | 605 | 505 | 505 | 305 |
| ***Non-Darcy skin*** | 0.5 | 0.7 | 0.7 | 0.6 |
| ***Matrix porosity*** | 0.02 | 0.07 | 0.07 | 0.06 |

Cumulative Production Sensitivity Analysis 1150

Simulation Results 1200

SHALE GAS PRODUCTION FORECASTING

RELATED APPLICATIONS

This application claims the benefit of U.S. Provisional Patent Application having Ser. No. 61/662,292, filed 20 Jun. 2012, which is incorporated by reference herein.

BACKGROUND

Exploration and development of formations such as shale gas formations continue to gain interest. Various examples of technologies, techniques, etc. described herein pertain to, for example, for exploration, development, production, etc. of formations.

SUMMARY

A method can include providing data for at least one shale gas formation; performing a statistical analysis on the data for each of the at least one shale gas formation; providing a simulation model; history matching the simulation model for each of the at least one shale gas formation based at least in part on the performed statistical analysis to generate a history matched model for each of the at least one shale gas formation; and forecasting production for another shale gas formation by plugging in data for the other shale gas formation into each generated history matched model. One or more computer-readable storage media can include computer-executable instructions to instruct a computing system to: access data for at least one shale gas formation; perform a statistical analysis on the data for each of the at least one shale gas formation; provide a simulation model; history match the simulation model for each of the at least one shale gas formations based at least in part on the performed statistical analysis to generate a history matched model for each of the at least one shale gas formations; and forecast production for another shale gas formation by plugging in data for the other shale gas formation into each generated history matched model. A system can include one or more processors; memory; and instructions stored in the memory and executable by at least one of the one or more processors to instruct the system to access data for at least one formation that has produced hydrocarbons; perform a statistical analysis on the data for each of the at least one formation; provide a model; history match the model for each of the at least one formation based at least in part on the performed statistical analysis to generate a history matched model for each of the at least one formation; and forecast production of hydrocarbons for another formation by plugging in data for the other formation into each generated history matched model. Various other apparatuses, systems, methods, etc., are also disclosed.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

FIG. 4 illustrates an example of a model;

FIGS. 6, 7 and 8 illustrates an example of a method;

DETAILED DESCRIPTION

Figure 1:
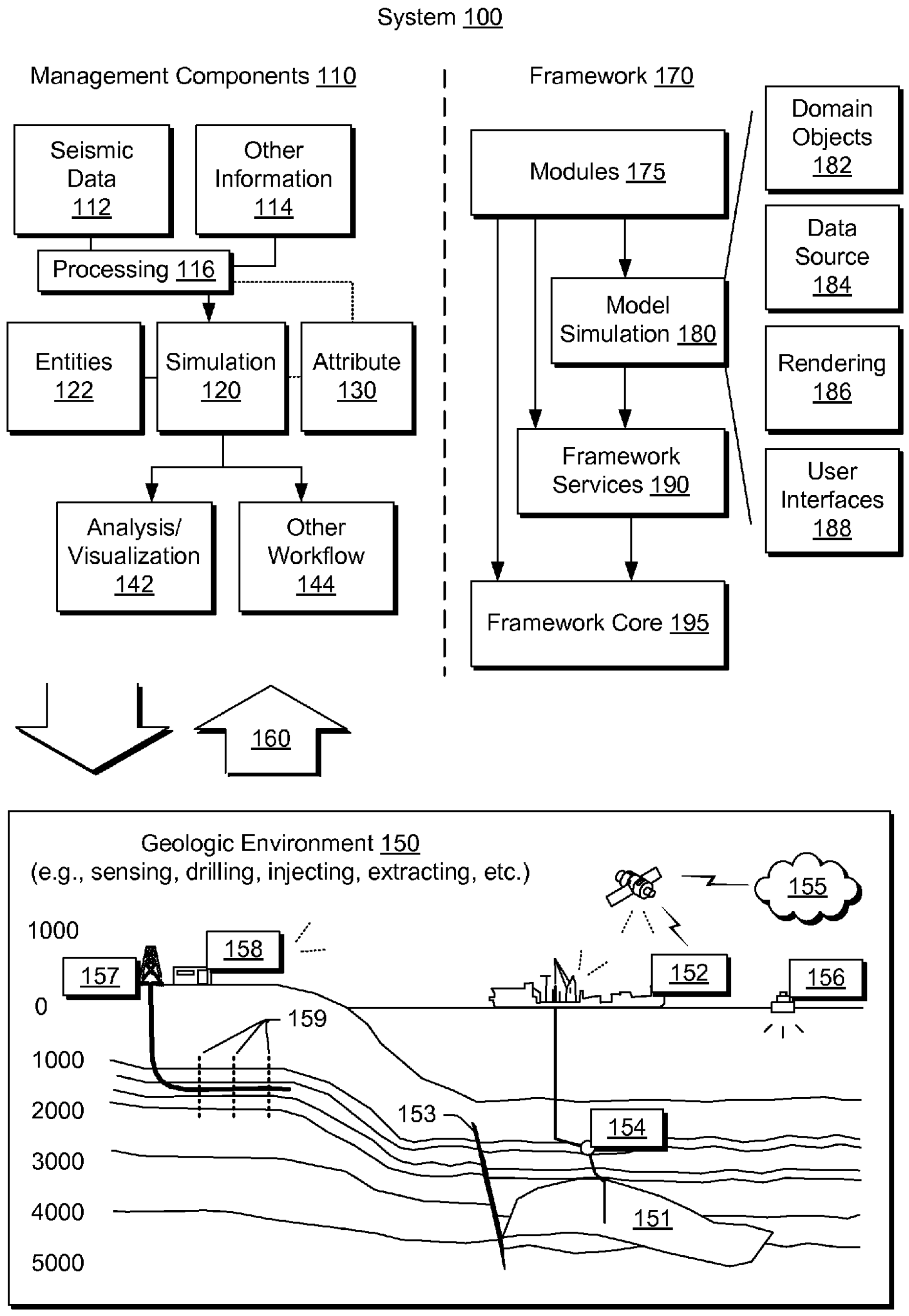
FIG. 1 illustrates an example system that includes various components for modeling a geologic environment.

The following description includes the best mode presently contemplated for practicing the described implementations. This description is not to be taken in a limiting sense, but rather is made merely for the purpose of describing the general principles of the implementations. The scope of the described implementations should be ascertained with reference to the issued claims.

Geologic formations include rock, which may be characterized by, for example, porosity values and by permeability values. Porosity may be defined as a percentage of volume occupied by pores, void space, volume within rock that can include fluid, etc. Permeability may be defined as an ability to transmit fluid, measurement of an ability to transmit fluid, etc.

The term "effective porosity" may refer to interconnected pore volume in rock, for example, that may contribute to fluid flow in a formation. As effective porosity aims to exclude isolated pores, effective porosity may be less than total porosity. As an example, a shale formation may have relatively high total porosity yet relatively low permeability due to how shale is structured within the formation.

As an example, shale may be formed by consolidation of clay- and silt-sized particles into thin, relatively impermeable layers. In such an example, the layers may be laterally extensive and form caprock. Caprock may be defined as relatively impermeable rock that forms a barrier or seal with respect to reservoir rock such that fluid does not readily migrate beyond the reservoir rock. As an example, the permeability of caprock capable of retaining fluids through geologic time may be of the order of about $10^{-6}$ to about $10^{-8}$ D (darcies).

The term "shale" may refer to one or more types of shales that may be characterized, for example, based on lithology, etc. In shale gas formations, gas storage and flow may be related to combinations of different geophysical processes. For example, regarding storage, natural gas may be stored as compressed gas in pores and fractures, as adsorbed gas (e.g., adsorbed onto organic matter), and as soluble gas in solid organic materials.

Gas migration and production processes in gas shale sediments can occur, for example, at different physical scales. As an example, production in a newly drilled wellbore may be via large pores through a fracture network and then later in time via smaller pores. As an example, during reservoir depletion, thermodynamic equilibrium among kerogen, clay and the gas phase in pores can change, for example, where gas begins to desorb from kerogen exposed to a pore network.

Sedimentary organic matter tends to have a high sorption capacity for hydrocarbons (e.g., adsorption and absorption processes). Such capacity may depend on factors such as, for example, organic matter type, thermal maturity (e.g., high maturity may improve retention) and organic matter chemical composition. As an example, a model may characterize a formation such that a higher total organic content corresponds to a higher sorption capacity.

With respect to a shale formation that includes hydrocarbons (e.g., a hydrocarbon reservoir), its hydrocarbon producing potential may depend on various factors such as, for example, thickness and extent, organic content, thermal maturity, depth and pressure, fluid saturations, permeability, etc. As an example, a shale formation that includes gas (e.g., a gas reservoir) may include nanodarcy matrix permeability (e.g., of the order of $10^{-9}$ D) and narrow, calcite-sealed natural fractures. In such an example, technologies such as stimulation treatment may be applied in an effort to produce gas from the shale formation, for example, to create new, artificial fractures, to stimulate existing natural fractures (e.g., reactivate calcite-sealed natural fractures), etc.

Shale may vary by, for example, one or more of mineralogical characteristics, formation grain sizes, organic contents, rock fissility, etc. Attention to such factors may aid in designing an appropriate stimulation treatment. For example, an evaluation process may include well construction (e.g., drilling one or more vertical, horizontal or deviated wells), sample analysis (e.g., for geomechanical and geochemical properties), open-hole logs (e.g., petrophysical log models) and post-fracture evaluation (e.g., production logs). Effectiveness of a stimulation treatment (e.g., treatments, stages of treatments, etc., may determine flow mechanism(s), well performance results, etc.

As an example, a stimulation treatment may include pumping fluid into a formation via a wellbore at pressure and rate sufficient to cause a fracture to open. Such a fracture may be vertical and include wings that extend away from the wellbore, for example, in opposing directions according to natural stresses within the formation. As an example, proppant (e.g., sand, etc.) may be mixed with treatment fluid to deposit the proppant in the generated fractures in an effort to maintain fracture width over at least a portion of a generated fracture. For example, a generated fracture may have a length of about 500 ft extending from a wellbore where proppant maintains a desirable fracture width over about the first 250 ft of the generated fracture.

In a stimulated shale gas formation, fracturing may be applied over a region deemed a "drainage area" (e.g., consider at least one well with at least one artificial fracture), for example, according to a development plan. In such a formation, gas pressure (e.g., within the formation's "matrix") may be higher than in generated fractures of the drainage area such that gas flows from the matrix to the generated fractures and onto a wellbore. During production of the gas, gas pressure in a drainage area tends to decrease (e.g., decreasing the driving force for fluid flow, for example, per Darcy's law, Navier-Stokes equations, etc.). As an example, gas production from a drainage area may continue for decades; however, the predictability of decades long production (e.g., a production forecast) can depend on many factors, some of which may be uncertain (e.g., unknown, unknowable, estimated with probability bounds, etc.).

Various shale gas formations have and are producing gas economically, which has widened interest gas production in other areas. For example, several shale gas exploration projects are under-way in diverse regions of the world, including Europe and Africa. However, a lack of understanding of various elements controlling well productivity, and limitations of available tools to adequately characterize a shale gas formation and forecast production from wells drilled therein, make it difficult to predict likely commercial value of a project. Factors that may impact a value assessment may include, for example, drilling costs, associated number of wells to develop a shale gas region, production return that each well can deliver, etc.

As an example, a method can generate, based at least in part on a statistical analysis of data from a selected shale gas formation (e.g., a play), a history matched reservoir simulation model that can represent shale gas behavior during production (e.g., a production phase) and that can be used for forecasting purposes in a new exploration area, for which data may be of limited availability. For example, a history matched reservoir simulation model (e.g., for a selected different existing, well-characterized play) may be recast using a limited amount of available data to generate a production outcome for a new exploration area (new play). In such an example, the statistical analysis may provide a case or scenario for production with respect to time, such as one of a P10 production curve, a P50 production curve, a Pave production curve or a P90 production curve. Such an example may be referred to as a single formation and single production curve method. As an example, such a method may include fitting the single production curve to provide a fit curve and then extrapolating the fit curve in time. A simulation model may then be history matched to the extrapolated production curve (e.g., a fit decline curve that models decline of production, for example, via exponential decay, harmonic decay, hyperbolic decay, etc.). The history matched model may then be used for forecasting purposes in a new exploration area, for which data may be of limited availability. As to decay or decline curves, each may include one or more parameters that may be fit (e.g., via error minimization, plotting, etc.). As an example, an exponential decline curve may include a fit parameter "a" (e.g., q(t)=qi*exp(−a"t)), a hyperbolic decline curve may include fit parameters "a" and "b" (e.g., q(t)=qi/((1+a*b*t)^(1/b))) and a harmonic decline curve may be a form of a hyperbolic decline curve where the parameter "b" is unity (e.g., (e.g., q(t)=qi/(1+a*t)).

As an example, a method can generate, based at least in part on statistical analyses of data from a selected shale gas formation (e.g., a play), a series of history matched reservoir simulation model that can represent shale gas behavior during production (e.g., a production phase) and that can be used for forecasting purposes in a new exploration area, for which data may be of limited availability. For example, a series of history matched reservoir simulation model (e.g., for a selected different existing, well-characterized play) may be recast using a limited amount of available data to generate a production outcome for a new exploration area (new play). In such an example, the statistical analyses may provide various cases or scenarios for production with respect to time, such as, for example, two or more of a P10 production curve, a P50 production curve, a Pave production curve or a P90 production curve. Such an example may be referred to as a single formation and multiple production curve method. As an example, such a method may include fitting each of the production curves to provide fit curves and then extrapolating each fit curve in time (e.g., a decade or more). A simulation model may then be history matched to each of the extrapolated production curves (e.g., a fit decline curve that models decline of production, for example, via exponential decay, harmonic decay, hyperbolic decay, etc.).

Such an approach may provide a series of history matched models, for example, one for each fit curve. As an example, multiple fit curves may be used for history matching to generate a single history matched model, for example, one that may generate simulation results that match a P10 case, a P50 case, a Pave case, a P90 case responsive to input parameters that may have associated uncertainties. The history matched model or models may then be used for forecasting purposes in a new exploration area, for which data may be of limited availability.

As an example, a method can generate, based at least in part on statistical analyses of data from selected shale gas formations (plays), a series of history matched reservoir simulation models that can represent shale gas behavior during production (e.g., a production phase) and that can be used for forecasting purposes in a new exploration area, for which data may be of limited availability. For example, history matched reservoir simulation models (e.g., for a selected number of different existing, well-characterized plays) may be recast using a limited amount of available data to generate a series of production outcomes for a new exploration area (new play). In such an example, the statistical analyses may provide various cases or scenarios for production with respect to time. As an example, for each of the selected gas formations, the statistical analyses may provide one or more production curves, such as, for example, one or more of a P10 production curve, a P50 production curve, a Pave production curve and a P90 production curve. Such an example may be referred to as a multiple formation and multiple production curve method (e.g., where each formation has at least one associated production curve). As an example, such a method may include fitting each of the production curves to provide fit curves and then extrapolating each fit curve in time (e.g., a decade or more). A simulation model may then be history matched to each of the extrapolated production curves (e.g., a fit decline curve that models decline of production, for example, via exponential decay, harmonic decay, hyperbolic decay, etc.). Such an approach may provide a series of history matched models, for example, one for each fit curve. As an example, multiple fit curves may be used for history matching to generate a single history matched model for each formation, for example, one that may generate simulation results that match a P10 case, a P50 case, a Pave case, a P90 case responsive to input parameters that may have associated uncertainties. As an example, a Pave case (e.g., a fit curve for Pave data) for a formation may be provided for purposes of history matching a simulation model to provide a history matched model for that formation. The history matched models may then be used for forecasting purposes in a new exploration area, for which data may be of limited availability.

As an example, history matching may be focused through sensitivity analysis to identify parameters that have the greatest impact on production, which may be, for example, reservoir parameters and/or operational/controlled parameters. When considering a new exploration area (new play), one or more history matched simulation models (e.g., for existing plays), as loaded with the limited data for the new exploration area (new play), can output a predicted production profile or profiles, the latter of which may, for example, range from optimistic to pessimist cases. As an example, parameters for development of that area may be optimized while accounting for possible behaviors described by the one or more models. In such an example, one or more history matched models for one or more corresponding existing shale gas formations may be considered proxy or surrogate models for another shale gas formation. A model may deemed a surrogate model, for example, where it has been history matched using data from a formation other than a formation of interest. Such a model may then "carry" data for a formation of interest to provide estimates, approximations, etc. of how that formation of interest may behave (e.g., responsive to an existing plan, existing development efforts, a prospective plan, prospective development efforts, etc.). Through plugging in at least a portion of available data for a "foreign formation", one or more surrogate models may help estimate ultimate recovery (EUR) from that foreign formation, for example, via one or more simulations with respect to future time using the one or more surrogate models.

As an example, a method may create a tool, for example, that may be applied to one or more areas of interest. For example, such a tool may be applied to an area of interest to produce forecasts within uncertainty bounds. As an example, such forecasts may be for a new exploration area where the forecasts are supported by the latest understood gas flow behavior in nanodarcy permeability rock (e.g., shale) and incorporate gas desorption physics.

As an example, a tool may be a numerical model or a set of numerical models, for example, that may be provided in the form of instructions executable by a processor of a computer, a computing device, a computing system, etc. For example, such instructions may be stored in memory accessible by a processor. As an example, a tool may be part of a modeling framework, part of a simulation framework, part of a modeling and simulation framework, a framework plug-in, a framework add-on, etc. As an example, output from a tool may be directed to one or more pieces of equipment, for example, to at least in part control a process, to plan a process, etc. For example, output from a tool may be input to a pad construction process, a drilling process, a stimulation process, a production process, etc.

As an example, a method may include providing a generalized model for well in shale formations (e.g., with constructs for modeling characteristics such as a matrix, a well, natural fractures, hydraulic fractures and stimulated fractures); providing production data for at least one developed shale gas formation (e.g., a field or a play); normalizing at least a portion of the data in time and providing, for each of the at least one formation, a corresponding set of probabilities (e.g., P10, P50/median, Pave (P average) and P90); determining production curves for the at least one formation based on a respective set of the probabilities; matching each production curve for the at least one formation using different types of decline curves; extrapolating production to future times (e.g., about a decade or more) based at least in part on one or more best fit parameters (e.g., to optionally estimate "ultimate" productions for the at least one formation); optionally verifying extrapolated curves for the at least one formation; performing sensitivity analysis aided history match of the generalized model to provide a specific, history matched model for each of the at least one formation (e.g., where sensitivity analysis identifies parameters with the biggest impact on production); plugging in data from a newly selected formation into each of the at least one history matched model; and simulating production for the newly selected formation using each of the at least one history matched model. As an example, results from a simulation may be used to assess the newly selected formation (e.g., as to production potential, etc.). As an example, one or more models for modeling the newly selected formation may be used to simulate one or more development scenarios (e.g., hydraulic fractures, number of wells, etc.) for the newly selected formation.

In oil and gas formations, a so-called "chance of success" may be determined, for example, as an estimate of the chance of geophysical, geochemical, etc. elements within a prospect working. A chance of success may be described as a probability, as being optimistic, as being pessimistic, as being high risk, as being low risk, etc. For example, a high risk prospect may have a less than about 10 percent chance of working, while a medium risk prospect may have about a 10 percent to about a 20 percent chance of working. As an example, a low risk prospect may have a chance of working of about over 20 percent.

As an example, probabilities may be selected from those that find use in oil and gas exploration and development. For example, a "proven reserve" may be defined as "reasonably certain" to be producible using current technology at current prices, with current commercial terms and government consent may be known in the industry as 1P; while some may refer to it as P90 (e.g., having about a 90 percent certainty of being produced). A so-called "probable reserve" may be defined as "reasonably probable" of being produced using current or likely technology at current prices, with current commercial terms and government consent may be deemed 2P (e.g., proven plus probable) or P50 (e.g., having about a 50 percent certainty of being produced). A so-called "possible reserve" may be defined as having a chance of being developed under favorable circumstances and may be deemed 3P (e.g., proven plus probable plus possible) or P10 (e.g., having about a 10 percent certainty of being produced).

Below, an example of a system is described followed by various technologies, including examples of techniques, which may, for example, include modeling one or more formations and, for example, using modeling results to take steps toward development, production, etc. As an example, modeling result information (e.g., values, states, etc.) may be transmitted to one or more pieces of equipment, which may include controllers, actuators, etc. that can act at least in part on such information (e.g., to start a process, stop a process, alter a process, etc.).

FIG. 1 shows an example of a system 100 that includes various management components 110 to manage various aspects of a geologic environment 150 (e.g., an environment that includes a sedimentary basin, a reservoir 151, one or more fractures 153, etc.). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142 and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may rely on a software framework such as an object-based framework. In such a framework, entities may include entities based on pre-defined classes to facilitate modeling and simulation. A commercially available example of an object-based framework is the MICROSOFT® .NET™ framework (Redmond, Wash.), which provides a set of extensible object classes. In the .NET™ framework, an object class encapsulates a module of reusable code and associated data structures. Object classes can be used to instantiate object instances for use in by a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results. As an example, output from the simulation component 120 may be input to one or more other workflows, as indicated by a workflow component 144.

As an example, the simulation component 120 may include one or more features of a simulator such as the ECLIPSE™ reservoir simulator (Schlumberger Limited, Houston Tex.), the INTERSECT™ reservoir simulator (Schlumberger Limited, Houston Tex.), etc. As an example, a reservoir or reservoirs may be simulated with respect to one or more enhanced recovery techniques (e.g., consider a thermal process such as SAGD, etc.).

In an example embodiment, the management components 110 may include features of a commercially available simulation framework such as the PETREL® seismic to simulation software framework (Schlumberger Limited, Houston, Tex.). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of simulating a geologic environment).

In an example embodiment, various aspects of the management components 110 may include add-ons or plug-ins that operate according to specifications of a framework environment. For example, a commercially available framework environment marketed as the OCEAN® framework environment (Schlumberger Limited, Houston, Tex.) allows for integration of add-ons (or plug-ins) into a PETREL® framework workflow. The OCEAN® framework environment leverages .NET® tools (Microsoft Corporation, Redmond, Wash.) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization. Such a model may include one or more grids.

The model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

In the example of FIG. 1, the domain objects 182 can include entity objects, property objects and optionally other objects. Entity objects may be used to geometrically represent wells, surfaces, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may include layers (e.g., stratification) that include a reservoir 151 and that may be intersected by a fault 153. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may additionally or alternatively include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop the reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

As mentioned, the system 100 may be used to perform one or more workflows. A workflow may be a process that includes a number of worksteps. A workstep may operate on data, for example, to create new data, to update existing data, etc. As an example, a may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL® software, for example, that operates on seismic data, seismic attribute(s), etc. As an example, a workflow may be a process implementable in the OCEAN® framework. As an example, a workflow may include one or more worksteps that access a module such as a plug-in (e.g., external executable code, etc.).

Figure 2:
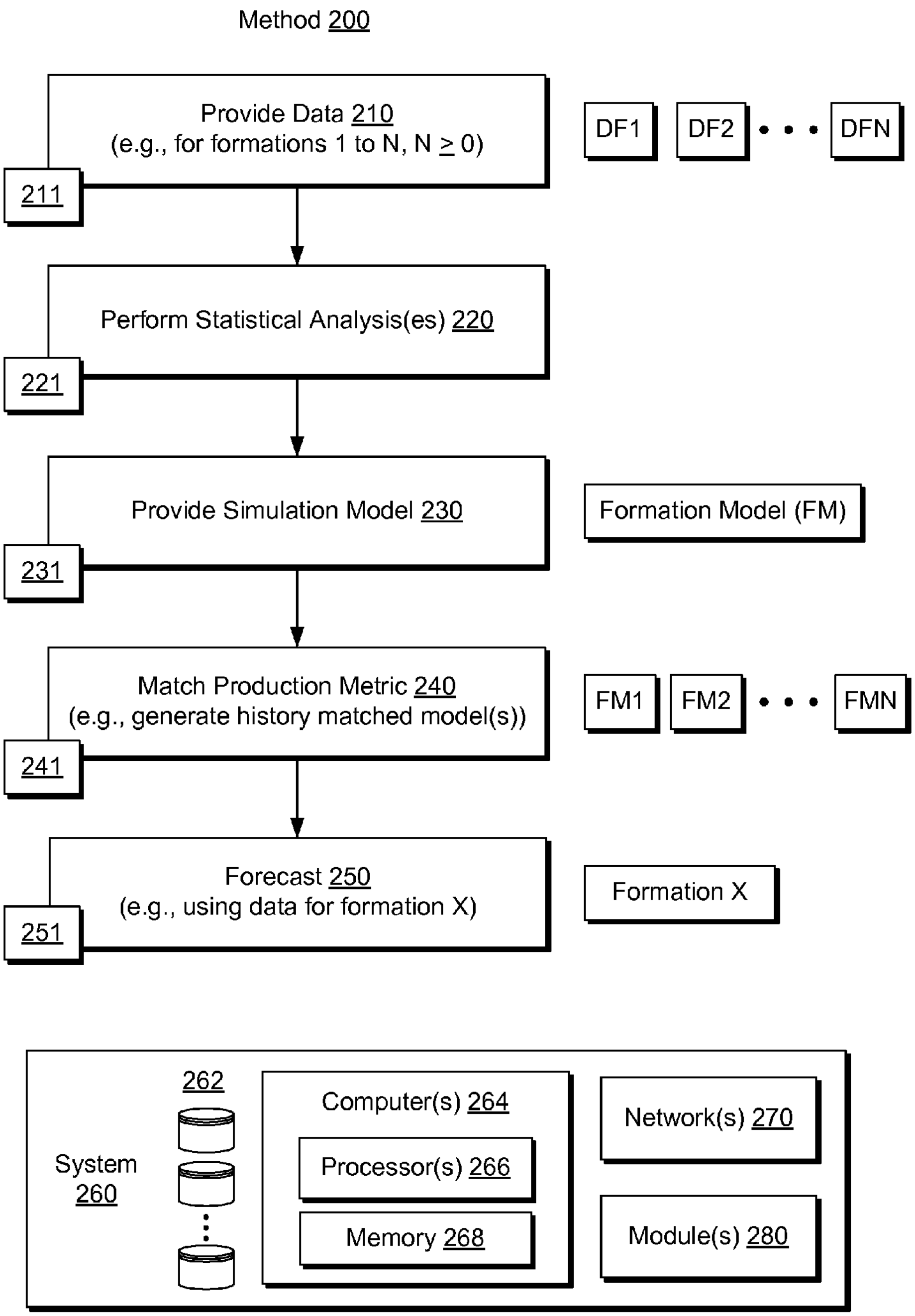
FIG. 2 illustrates an example of a method and an example of a system.

FIG. 2 shows an example of a method 200 and an example of a system 260. The method 200 includes a provision block 210 for providing data for at least one formation (e.g., formations 1 to N, where N is greater than or equal to 0), a performance block 220 for performing statistical analysis(es) (e.g., using at least a portion of the provided data), a provision block 230 for providing a simulation model (e.g., a formation model), a match block 240 for matching simulation results and results from the statistical analysis(es) (e.g., to generate at least one history matched formation model) and a forecast block 250 for forecasting, for example, production for a formation X (e.g., which is a formation other than one of the formations 1 to N).

In the example of FIG. 2, the system 260 includes one or more information storage devices 262, one or more computers 264, one or more networks 270 and one or more modules 280. As to the one or more computers 264, each computer may include one or more processors (e.g., or processing cores) 266 and memory 268 for storing instructions (e.g., modules), for example, executable by at least one of the one or more processors. As an example, a computer may include one or more network interfaces (e.g., wired or wireless), one or more graphics cards, a display interface (e.g., wired or wireless), etc. As an example, a system may include one or more modules, which may be provided to analyze data, control a process, perform a task, perform a workstep, perform a workflow, etc.

The method 200 is shown in FIG. 2 in association with various computer-readable media (CRM) blocks 211, 221, 231, 241 and 251. Such blocks generally include instructions suitable for execution by one or more processors (or processor cores) to instruct a computing device or system to perform one or more actions. While various blocks are shown, a single medium may be configured with instructions to allow for, at least in part, performance of various actions of the method 200. As an example, a computer-readable medium (CRM) may be a computer-readable storage medium.

Figure 3:
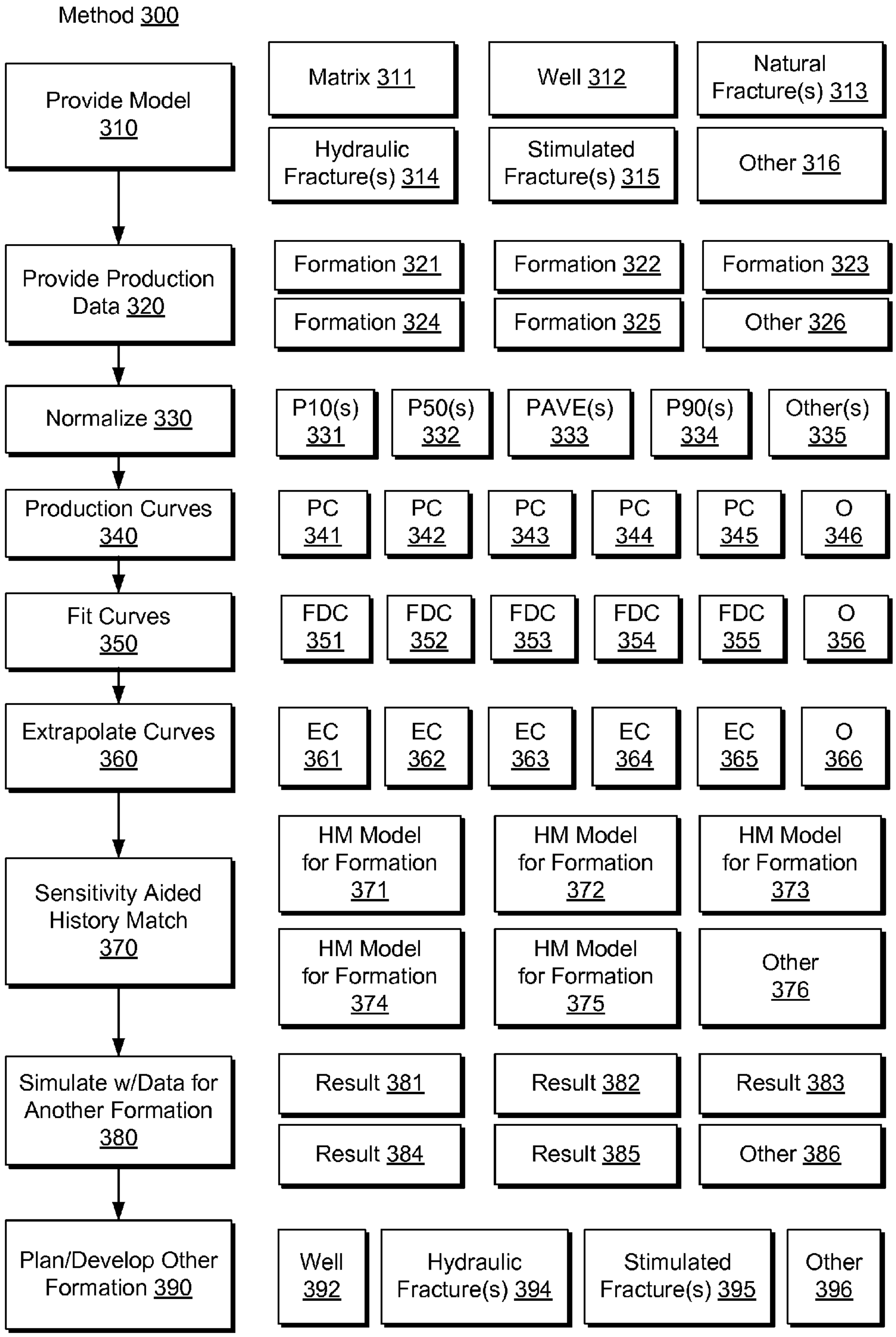
FIG. 3 illustrates an example of a method.

FIG. 3 shows an example of a method 300. As shown the method 300 can include a provision block 310 for providing a generalized model for well in shale formations (e.g., with constructs for modeling characteristics such as a matrix 311, a well 312, natural fractures 313, hydraulic fractures 314, stimulated fractures 315 and optionally other characteristics 316); a provision block 320 for providing production data for at least one developed shale gas formation (e.g., consider selecting from formations 321, 322, 323, 324, 325 or other geologic environment 326); a normalization block 330 for normalizing at least a portion of the data in time and providing, for at least one formation, a corresponding set of probabilities (see, e.g., P10 331, P50/median 332, Pave (P average) 333, P90 334 and optionally one or more other probabilities 335); a determination block 340 for determining production curves for the at least one formations based on a respective set of the probabilities (see, e.g., PC 341, PC 342, PC 343, PC 344, PC 345, and optionally other curve 346); a fit block 350 for fitting each production curve for the at least one formation using one or more type of decline curve (e.g., exponential, hyperbolic, harmonic, etc.) to provide fit decline curves (e.g., FDC 351, FDC 352, FDC 353, FDC 354, FDC 355 or other fit curve 356); an extrapolate block 360 for extrapolating production to future times (e.g., using fit decline curves to provide extrapolated curves per EC 361, EC 362, EC 363, EC 364, EC 365 and optionally other extrapolated curve 366), for example, based at least in part on best fit parameters (e.g., to optionally estimate "ultimate" productions for the at least one formation); an optional verification block for verifying extrapolated curves for the at least one formation; a performance block 370 for performing sensitivity analysis aided history match of the generalized model to provide a specific, history matched model for each of the at least one formation, for example, where sensitivity analysis identifies parameters with the biggest impact on production (see, e.g., history matched models 371, 372, 373, 374, 375 and optionally other matched model 376); and a simulation block 380 for plugging in data from a newly selected formation into each of the at least one history matched model and simulating production for the newly selected formation using each of the at least one history matched models (see, e.g., simulation results 381, 382, 383, 384, 385, and optionally other results 386).

As shown in the example of FIG. 3, per a plan and/or development block 390, as an example, results from the simulations may be used to assess the newly selected formation (e.g., as to production potential, etc.), for example, one or more models for modeling the newly selected formation may be used to simulate one or more planning and/or development scenarios for the newly selected formation (see, e.g., well 392, hydraulic fractures 394, stimulated fracture 395 and optionally other features for planning, development and/or production 396).

FIG. 4 shows an example of a model 401 that includes constructs to model (e.g., equations), for example, a matrix 411, a well 412, natural fractures 413, hydraulic fractures 414, stimulated fractures 415 and stimulated inter-hydraulic fracture region 416. In the example of FIG. 4, the model 401 may encompass a drainage area, for example, defined as covering a surface area and as having a depth or depths. Given parameter values for the various constructs (e.g., locations, characteristics, etc.), the model 401 may be formulated with respect to a grid 405 to form a numerical model suitable for providing solutions via a numerical solver.

In the example of FIG. 4, the grid 405 is shown as a three-dimensional grid with a well head 409 for a well that extends along an x-axis where hydraulic fractures and other constructs may be modeled within the grid 405. As an example, by inputting the model and parameters into a numerical solver, results may be generated. For example, results may include pressure values. In the example of FIG. 4, contours are shown with respect to the grid 405 that may represent pressure isobars where outer isobars are at higher pressures than an inner isobar, which may correspond to pressure in a horizontal wellbore. As mentioned, where pressure is higher in a matrix and fractures that intersect a wellbore than in the wellbore, fluid may flow from the matrix and fractures to the wellbore. As fluid is depleted from the matrix, pressure may drop and hence production may drop. The model 401, as gridded per the grid 405, may be used to simulate production with respect to time, for example, for future times to estimate how depletion occurs and to estimate an ultimate recovery (e.g., EUR).

As an example, the model 401 may be a model suitable for use in a framework such as the ECLIPSE® framework. As an example, the model may implement a dual porosity approach (e.g., a continuum approach) for at least a portion of a formation (e.g., a drainage area). As an example, such a model may include one or more constructs analogous to a coal bed/methane gas model, for example, where such one or more constructs are adapted to a shale gas formation.

As an example, a model may include equations for dual porosity and equations for sorption (e.g., desorption). With respect to a grid, grid cells may be considered to be "coal"; noting that the model is applied to shale.

Due to the very low stress anisotropy in shale gas formations, hydraulic fractures may be non-planar fractures that may develop a complex fracture network. Expansion of these non-planar hydraulic fractures may be represented in a model as a wide simulation cell that includes a relatively high permeability.

For a fracture system, natural fractures within a shale gas formation may also be considered. Such natural fractures may be found to be mineralized (e.g., calcite, etc.) or inactive. A model may include equations that provide for reactivation of such fractures, for example, responsive to hydraulic fracturing where microfractures are reopened to provide for fluid flow. Such fractures may be considered as being stimulated fractures. As an example, a model may include four types of permeable media: matrix, natural fractures, stimulated fractures, and hydraulic fractures. As to a desorption process, a model may include equations that account for a Langmuir pressure and a Langmuir volume.

Figure 5:
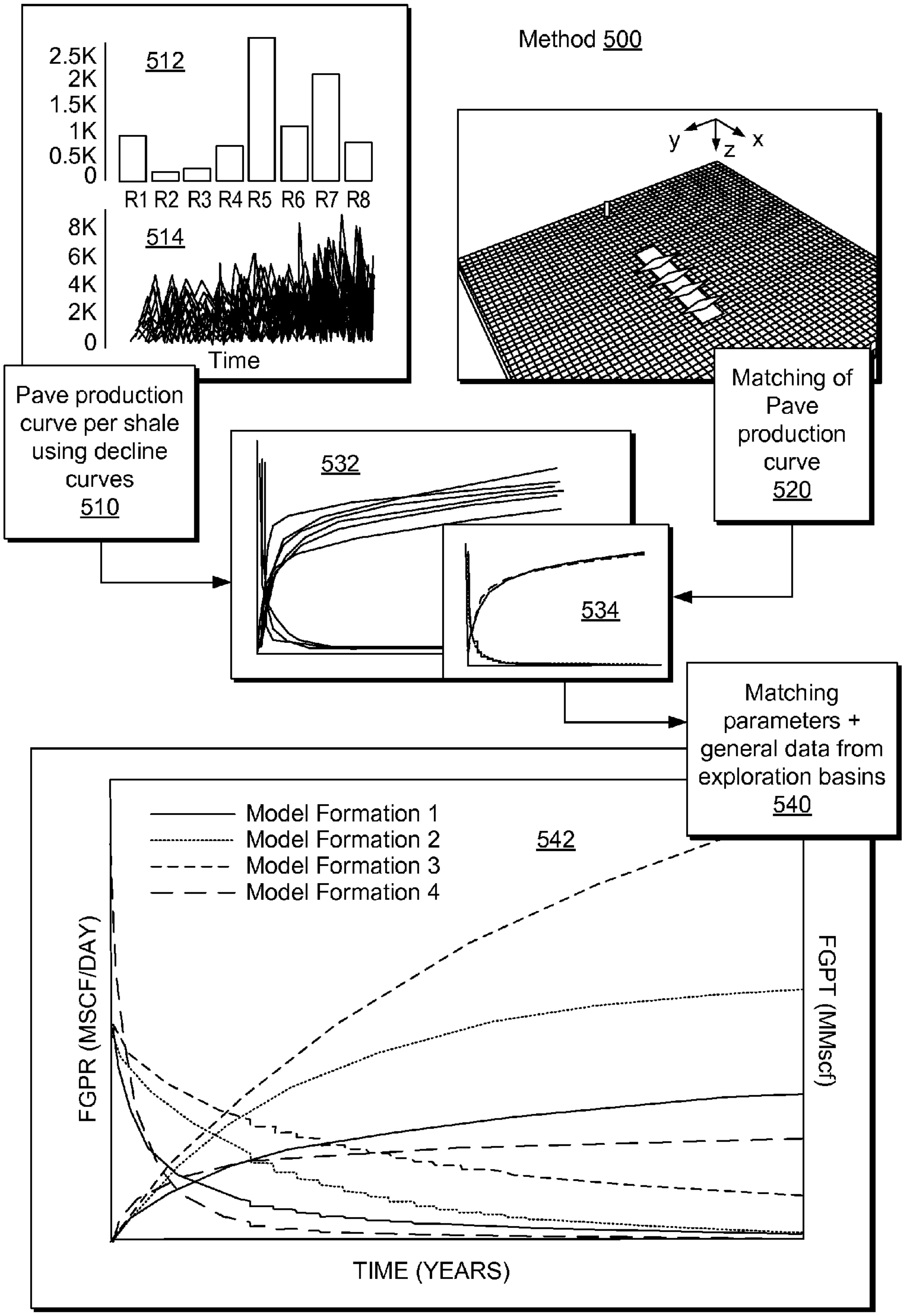
FIG. 5 illustrates an example of a method.

FIG. 5 shows an example of a method 500 that includes a production curve block 510 for generating production curves 532 for regions 512 and associated production data 514 (e.g., production data with respect to time for each of the regions 512); a matching block 520 for matching a model to each of the production curves to generate individual matched production curves 534 and multiple matched models; and a forecast or extrapolation block 540 for forecasting or extrapolating production curves for multiple formations (see, e.g., a plot 542). As an example, data for a region other than one of the regions 512 may be provided and input to one or more of the matched models to, for example, generate a forecast for that region. As an example, data for a region other than one of the regions 512 may be provided and input to more than one of the matched models to, for example, generate forecasts for that region. For example, FIG. 5 shows the plot 542 as including four sets of curves where each set includes a production decline curve and a cumulative production curve. In the example of FIG. 5, each set of curves corresponds to a particular formation (e.g., Formation 1, Formation 2, Formation 3 and Formation 4).

As an example, the sets of curves in the plot 542 may correspond to four production forecast cases run by introducing Silurian shale field data into already calibrated US shale play analogues (e.g., surrogate models). Such curves may be analyzed as to chance of success, etc. For example, in trials for the Silurian shale field based on data for the Barnett, Woodford, Haynesville and Fayetteville formations, the most optimistic scenario was given by the Haynesville case, followed by the ones for Barnett, Woodford and Fayetteville, respectively (e.g., where cumulative production was taken to a present production value).

Figure 8:
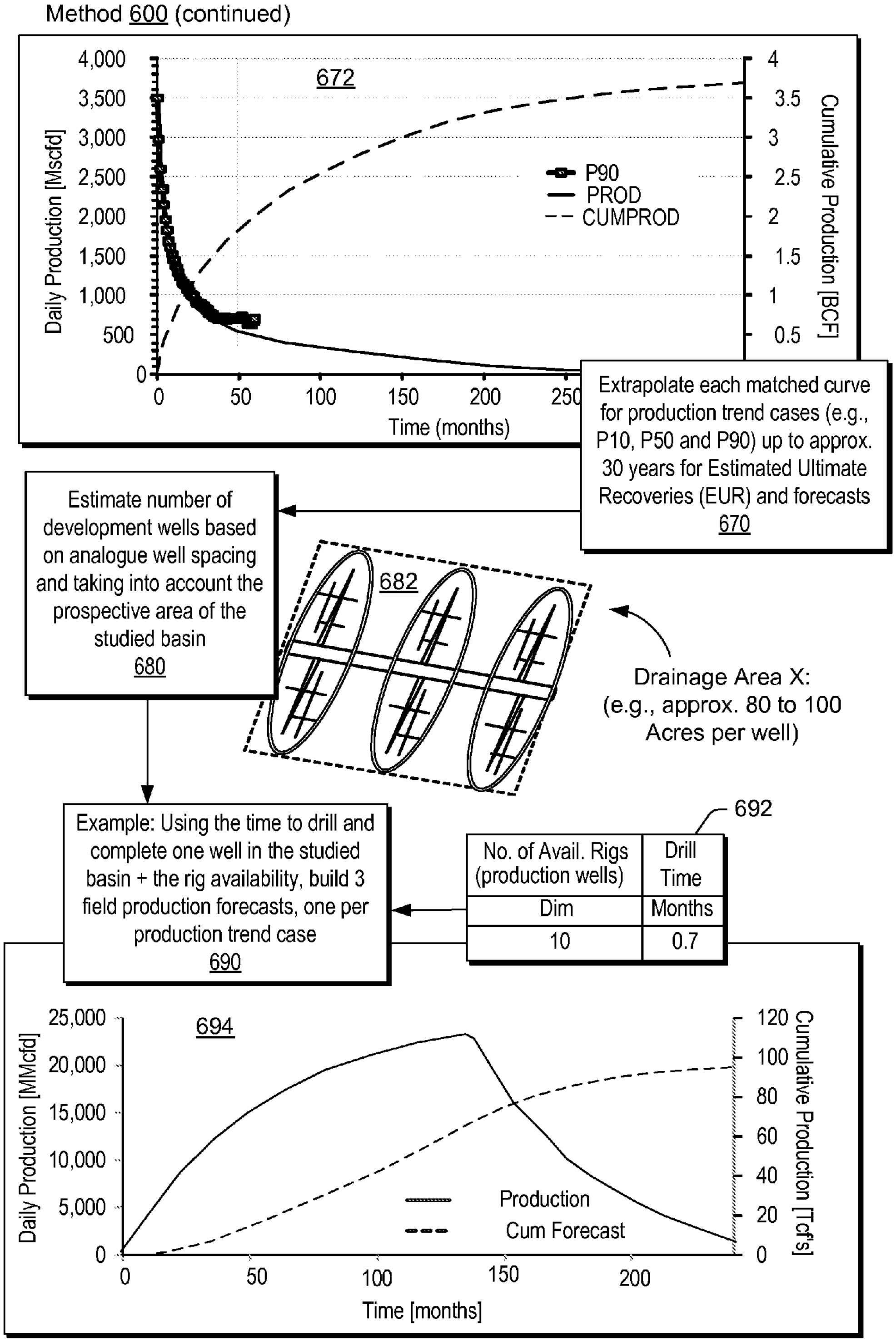

FIGS. 6, 7 and 8 show an example of a method 600. As shown in FIG. 6, the method 600 includes an identification or selection block 610 for identifying or selecting gas shale basins (e.g., formations) with enough available production data per well for running a statistical analysis (e.g., >100 data points at a given time). For example, a map is shown with formations F1, F2, F3 and F4, which may correspond to, for example, Haynesville (F1), Barnett (F2), Fayetteville (F3) and Woodford (F4) formations. As shown in FIG. 6, the method 600 includes a retrieval block 620 for retrieving core characteristics of the shale formations, for example, including compiling a range of values for one or more of the following: (a) GIIP/section, (b) reservoir pressure, (c) net thickness, (d) TOC, (e) Ro, (f) horizontal section of the well, (g) number of fracturing stages per well, and (h) number of clusters per stage. As shown in FIG. 6, the method 600 can include a plot block 630, for example, for plotting information retrieved through spider graph plots 632 to select an appropriate analogue per basin (e.g., per formation). In such an example, differences may be ascertained, for example, via calculations and/or visual inspection of area encompassed by values for different regions of a formation, different formations, etc., plotted as a spider graph plot (see, e.g., different lines in FIG. 6). A method may optionally include one or more spider graphs (e.g., or radar charts) for displaying multivariate data (e.g., as a two-dimensional chart of three or more quantitative variables represented on axes starting from the same point).

As an example, an equation 634 may be implemented for purposes of assessing data, information, etc. In the equation 634, q is a gas flow (e.g., at standard conditions), k is a permeability, h is a length dimension (e.g., a thickness vertically for a horizontal well), $p_e$ and $p_{wf}$ are pressures (e.g., an effective pressure and a "bottom hole" pressure), T is a temperature (e.g., formation temperature about a wellbore, for example, in a drainage region), $\mu_g$ is a gas viscosity, z is a compressibility factor, $r_e$ and $r_w$ are radii (e.g., an effective drainage radius and a wellbore radius), s is a skin effect coefficient, D may be a non-Darcy coefficient and the term $DQ_g$ may, for example, provide for a rate dependent skin factor. As an example, the equation 632 may include a constant, for example, as to units (e.g., 1422, etc.). As an example, an equation may account for radial flow of gas (e.g., from a formation to a wellbore). As an example, an equation may account for non-Darcy flow (e.g., an inertial or turbulent flow factor). As an example, an equation may be in a pressure-squared approximation form. As an example, flow may be modeled in various regimes, which may include Forchheimer, beyond Forchheimer, etc. As an example, a model may account for presence of one or more proppant materials in a fracture (e.g., flow with respect to proppant structure, packing, etc.). As an example, a model may include one or more Langmuir equations, for example, to model sorption and/or desorption (e.g., for adsorption and/or desorption of molecules on a material or materials, for example, including one or more Langmuir adsorption constants).

FIG. 7 shows examples of some additional blocks of the method 600. As shown, the method 600 can include a filter block 640 for filtering (e.g., for a selected analogue) non-representative well production data (e.g., old wells, horizontal lengths<about 500 m, etc.) and for normalizing filtered data. For example, consider the data 642, which may be filtered and normalized to product the filtered and normalized data 644. The method 600 may include a calculation block 650 for calculating a set of low, mid and high production trend cases using the well production data from a selected analogue (e.g., consider P10, P50, P90, Pave, etc.). For example, a plot 652 shows Pave and a plot 654 shows P90 according to such calculations. The method 600 may include a matching block 660 for matching calculated production trend cases using different decline curves. For example, consider the plots 662 and 664, which show Pave and P90 fit to various types of decline curves, for example, with corresponding fit parameter values. As mentioned, such fitting may include fitting to an exponential curve, a harmonic curve, a hyperbolic curve, etc. In the example of FIG. 7, the hyperbolic curve fits Pave with a fit parameter value of about 1.4 while the hyperbolic curve fits P90 with a fit parameter value of about 1.5.

FIG. 8 shows examples of some additional blocks of the method 600. For example, the method 600 can include an extrapolation block 670 for extrapolating each matched curve for various production trend cases (e.g., P10, P50 and P90) up to approximately 30 years for EUR and forecasts (see, e.g., a plot 672 for P90). As shown, the method 600 can include an estimation block 680 for estimate a number of development wells based on analogue well spacing, which can take into account the prospective area of the studied basin (e.g., formation of interest). For example, consider a model 682 for a drainage area X that includes a well. As an example, a well may serve a drainage area of approximately 80 to approximately 100 acres. As shown in FIG. 8, the method 600 may include a forecast block 690 for forecasting field production for a particular development plan. For example, using time to drill and complete one well in a studied basin and drilling rig availability (see, e.g., a table 692), the forecast block 690 may output a number of field production forecasts, for example, one per production trend case. An example plot 694 is shown in FIG. 8 with daily production and cumulative production over time (e.g., up to about 250 months into the future).

Figure 9:
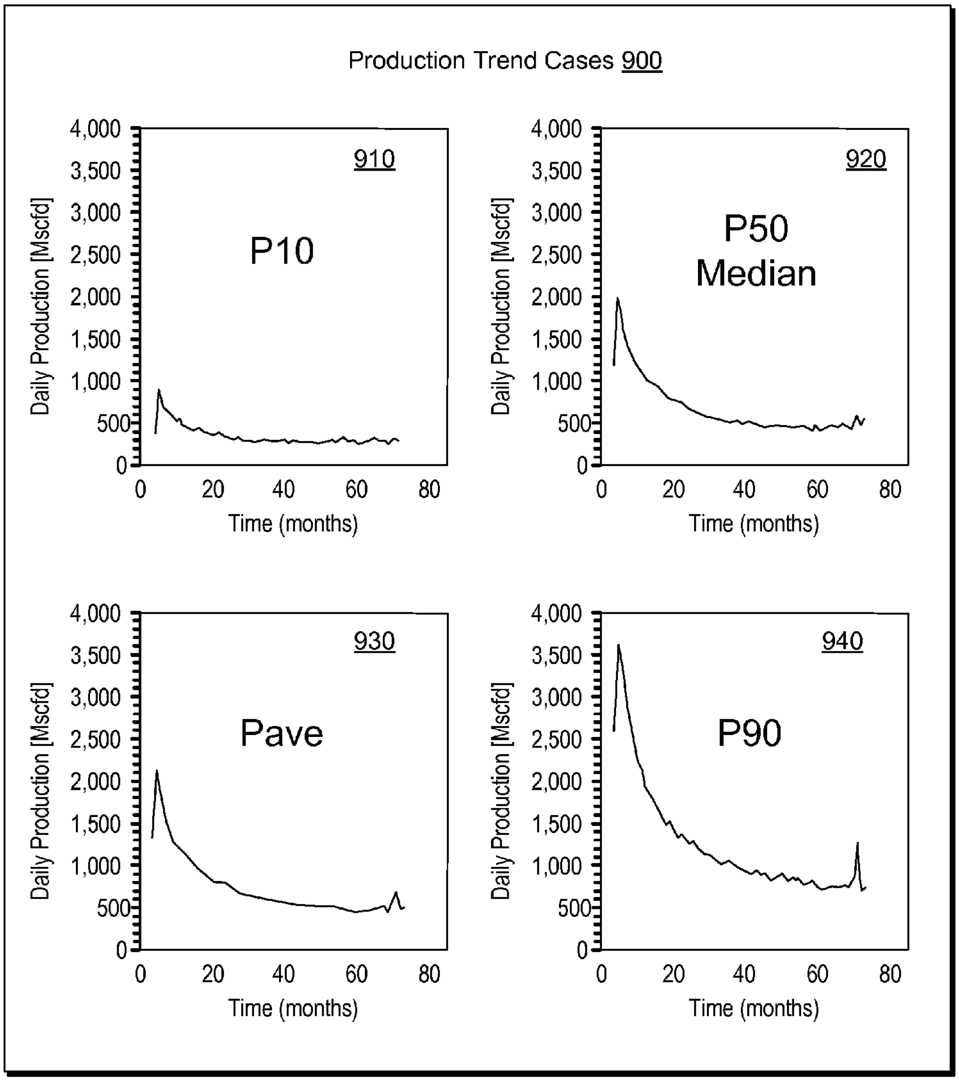
FIG. 9 illustrates examples of probabilities.
Figure 10:
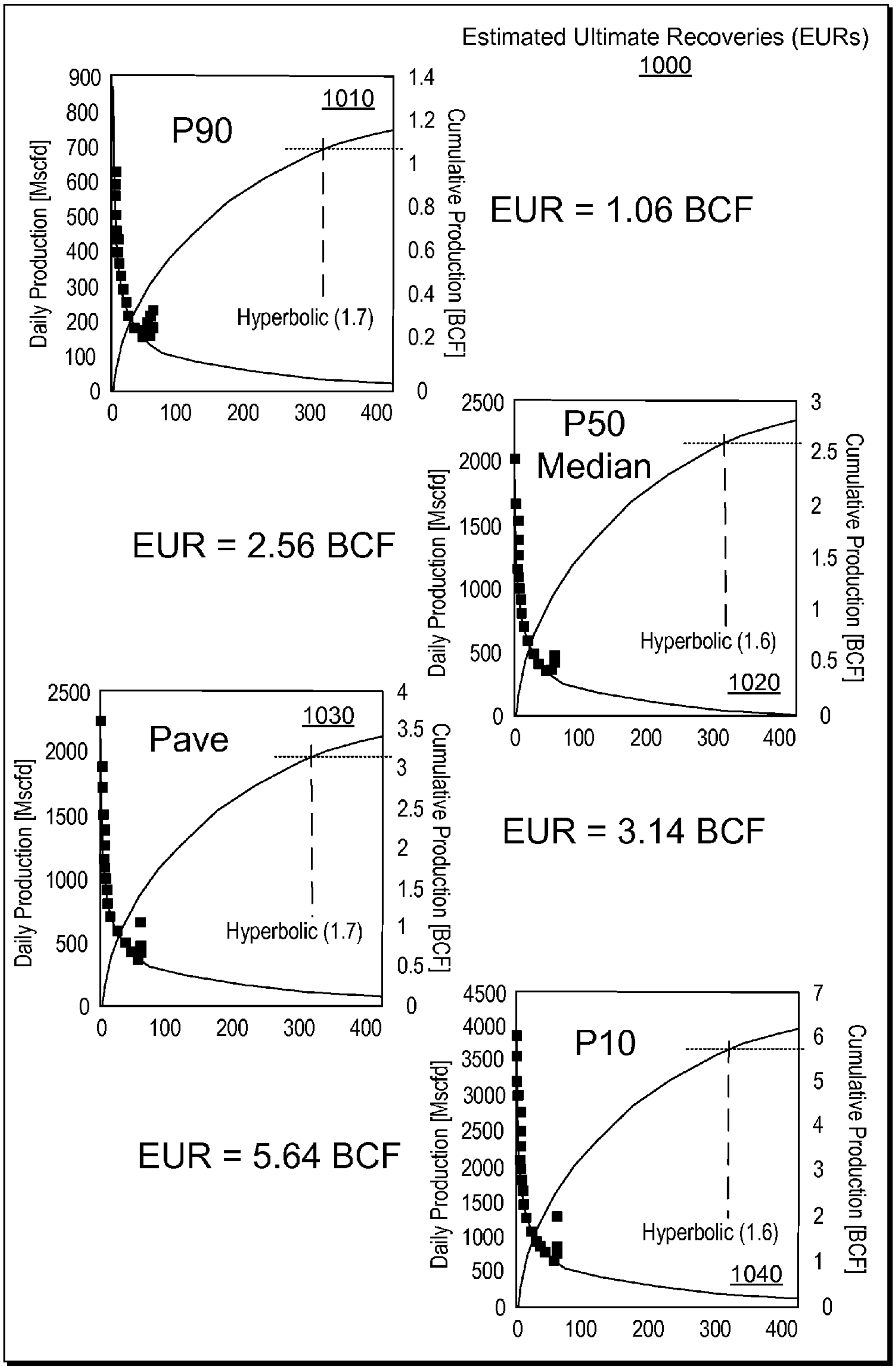
FIG. 10 illustrates examples of Estimated Ultimate Recoveries (EURs)
Figure 11:
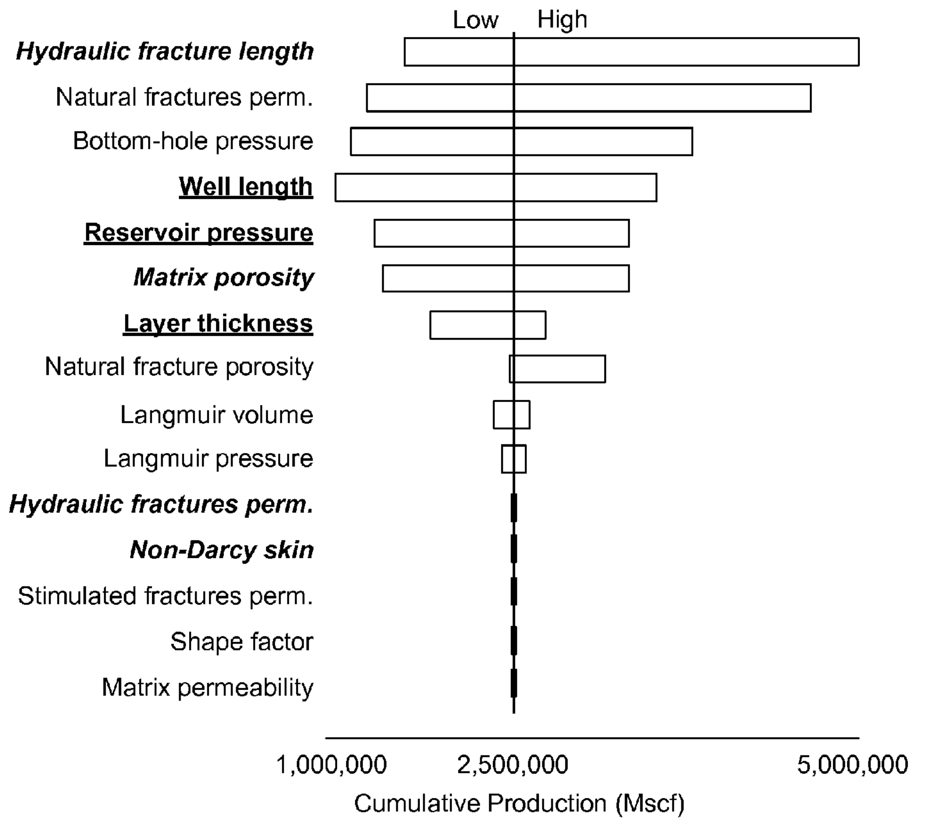
FIG. 11 illustrates examples of parameters and examples of sensitivities for examples of parameters.

FIGS. 9, 10 and 11 show various examples of results from an example of a method. As an example, based on statistical analysis of various shale gas basins, a synthetic reservoir simulation model can represent shale gas wells and be used for forecasting purposes in exploration areas where information may be limited in its availability. As an example, such a model can include accurate identification of parameters that impact on production (e.g., reservoir parameters, operational/controlled parameters, etc.) to allow for prediction of production profiles and, for example, optimization of controlled parameters.

As to an example involving statistical analysis, a method can include collecting historical production information for thousands of shale gas wells from various basins, categorizing the information categorized, for example, to exclude information from certain types of wells (e.g., vertical and short lateral wells), and screening the information in time (e.g., to retain information from more recent wells) to help assess aspects of technology with respect to time, to isolate one or more techniques (e.g., resulting from improved understanding of rock mechanical behavior and fracturing process with microseismic, 3D seismic for sweet-spot hunting, etc.), etc.

After collecting, categorizing and screening, such a method may include normalizing production data in time to derive a set of, for example, P10, P50, Pave, and P90 values from a reversed cumulative distribution curve (e.g., for determination of production curves for each basin).

FIG. 9 shows examples of production trend cases 900 for a shale gas formation, including a plot 910 for P10, a plot 920 for P50/Median, a plot 930 for Pave and a plot 940 for P90. Each of the trend cases extends to about 70 months (e.g., about 5.8 years), for example, where maximum daily production increases from P10 to P50 to Pave to P90.

As an example, a method may include, for a set of curves for each formation, fitting or matching using different decline curve types. In turn, the best fitting parameters may be used to extrapolate historical data per formation to get an estimated ultimate recovery, for example, up to about 30 years. As an example, extrapolation of the fitted or matched decline curves may optionally be compared to information from one or more additional sources, for example, to verify consistency of the extrapolated results.

FIG. 10 shows examples of estimated ultimate recoveries (EURs) 1000 for various trend cases such as the trend cases 900 of FIG. 9. For example, FIG. 10 shows a plot 1010 for P90 where a fit parameter for a hyperbolic curve has a value of about 1.7 and where daily production falls from about 900 to less than about 100 over about 400 months; a plot 1020 for P50 where a fit parameter for a hyperbolic curve has a value of about 1.6 and where daily production falls from about 2000 to less than about 100 over about 400 months; a plot 1030 for Pave where a fit parameter for a hyperbolic curve has a value of about 1.7 and where daily production falls from about 2500 to less than about 100 over about 400 months; and a plot 1040 for P10 where a fit parameter for a hyperbolic curve has a value of about 1.6 and where daily production falls from about 4000 to less than about 100 over about 400 months. Also shown in each of the plots 1010, 1020, 1030 and 1040 is EUR where P90 has an EUR of about 1.06 BCF, P50 has an EUR of about 2.56 BCF, Pave has an EUR of about 3.14 BCF and P10 has a EUR of about 5.64 BCF. Such values may be compared to "break-even" prices (e.g., based at least in part on gas prices) to determine which scenario may be economically viable, if any.

As an example, a method may include performing a sensitivity analysis. Such an analysis may be performed using a model. As an example, a model may be a dual-porosity model together with an instant sorption model within a simulation grid with about 106 cells in the x direction, about 107 cells in the y direction and about two cells in the z direction. Such a dual-porosity compositional model may model a fractured matrix, for example, with dimensions of about 5,280 feet in the x direction, about 5,285 feet in the y direction, and about 261 feet in the z direction. As an example, initial porosity and permeability values in the matrix may be set at about 0.06 and about 0.00017 mD, respectively. In fractured medium, the initial porosity value may be set to about 0.0004 and the initial permeability value may be set to about 0.00017 mD. As an example, a reservoir datum depth may be set at about 11,231 feet, and reservoir pressure may be defined as about 7,000 psi, where gas/water contact is located at the bottom of the 100 percent gas-saturated formation.

As to a well, as an example, a model may include a horizontal well of about 3,250 ft, which may be placed in approximately the middle of the model and, for example, divided into about seven hydraulic fracturing stages with two clusters in each, for a total of 14 hydraulic fractures, contained within the first layer. As an example, a hydraulic fracture length may be set to about 305 feet. As an example, a non-Darcy skin of 0.05 day/Mcf (e.g., caused by a gas turbulent flow regime) may be taken into account.

When in low-stress anisotropy gas shale formations, hydraulic fractures tend to be nonplanar and a complex fracture network may develop. The expansion of these nonplanar hydraulic fractures may be represented in a model as being highly permeable using a simulation cell about 50 ft wide. Natural fractures may also be considered where upon stimulation to form stimulated fractures, the initial permeability value may be set to about 0.1 mD and about 20 mD in the hydraulic fractures. As an example, desorption may include setting a Langmuir pressure to about 1,125 psi and a Langmuir volume to about 0.065 Mcf/ton.

As an example, provided with a model and various values for parameters of the model a sensitivity analysis may be performed, for example, to identify those elements with the greatest impact on the reservoir simulation results. As an example, a sensitivity analysis may consider a decade or more of "simulation" time. To start, parameters thought to have a high impact on production may be selected and their values were varied. Table 1 below shows variation of uncertain parameters in particular gas shale formations.

TABLE 1

| Variable | Low | Base | High |
|---|---|---|---|
| Matrix porosity (p.u) | 0.02 | 0.06 | 0.1 |
| Matrix permeability (mD) | 1.00E−05 | 0.00017 | 0.001 |
| Natural fracture porosity (p.u) | 5.00E−05 | 0.0004 | 0.02 |
| Natural fracture permeability (mD) | 1.00E−05 | 0.00017 | 0.001 |
| Shape factor (ft2) | 0.08 | 1.2 | 8 |
| Langmuir volume (Mcf/ton) | 0 | 0.065 | 0.11 |
| Langmuir pressure (psi) | 500 | 1,125.00 | 3,000.00 |
| Well length (ft) | 2,000.00 | 3,250.00 | 4,650.00 |
| Hydraulic fracture length (ft) | 105 | 305 | 1,005.00 |
| Hydraulic fracture permeability (mD) | 10 | 20 | 200 |
| Stimulated fracture permeability (mD) | 0.05 | 0.1 | 1 |
| Non-Darcy skin (day/Mcf) | 0.08 | 0.05 | 0.01 |
| Layer thickness (ft) | 190.5 | 261 | 402 |
| Bottom-hole pressure (psi) | 5,000.00 | 3,000.00 | 1,000.00 |
| Reservoir pressure (psi) | 5,000.00 | 7,000.00 | 9,000.00 |

FIG. 11 shows examples of parameters 1130 as being classified as being certain (underlined) and uncertain (italicized) as well as a tornado plot 1150 from a cumulative production sensitivity analysis. As indicated in the plot 1150, hydraulic fracture length and well section length may be positioned as the elements having the greatest impact on simulation results; noting that simulation results demonstrated that hydraulic fracture permeability had an impact in earlier time, but limited impact in later time. On the other hand, the permeability of natural fractures showed limited impact in earlier time, but greater impact in later time. This sensitivity analysis provided valuable information to focus history matching efforts (e.g., production matching).

As to history matching or production matching, as an example, a method can include averaging matched curves for each shale gas formation from a type curve analysis and then matching using a current simulation model. As parameters affecting production may have already been identified by performing a sensitivity analysis, the parameters may be varied within a range to adjust for the cumulative production and production rate. As an example, Table 2 below shows final tuned parameters for the aforementioned model (see also plots of FIGS. 9 and 10).

TABLE 2

| Variable | Haynes-ville | Barnett | Fayette-ville | Woodford |
|---|---|---|---|---|
| Hydraulic fracture perm. (mD) | 15 | 5 | 4.5 | 4.5 |
| Hydraulic fracture length (ft) | 605 | 505 | 505 | 305 |
| Non-Darcy skin (day/Mcf) | 0.5 | 0.7 | 0.7 | 0.6 |
| Natural fracture permeability (mD) | 0.0000083 | 0.00037 | 0.0000076 | 0.000043 |
| Stimulated fracture perm. (mD) | 0.00005 | 0.00004 | 0.00012 | 0.000045 |
| Matrix porosity | 0.02 | 0.07 | 0.07 | 0.06 |
| Natural fracture porosity | 0.0014 | 0.04 | 0.025 | 0.0004 |
| Layer thickness (ft) | 270 | 116 | 190 | 200 |
| Formation pressure (psi) | 9,883 | 4,472 | 1,919 | 4,281 |
| Formation depth (ft) | 11,231 | 7,710 | 4,265.10 | 9,514.40 |
| Well average length (ft) | 3,250 | 2,950 | 3,950 | 2,950 |

As shown in Table 2, the average values appear to be low for hydraulic fracture permeability and high for non-Darcy skin; however, one may consider that this results from an assumption that hydraulic fractures are opened and producing in the synthetic model; thus, such low values may suggest flow instabilities through the hydraulic fractures. Also, the length of the hydraulic fractures was considered equal in the model; whereas, this may differ from the field. Thus, an assumption that they are of equal length may affect their estimated values or contribute to uncommon values for hydraulic fracture permeability and non-Darcy skin.

Formation characteristics may differ from one shale formation to another. As an example, matrix porosity may tend to have a similar value across selected shale formations; however, porosity and permeability of natural fractures may vary considerably, which may be attributed to specific and distinct mineralogy found in each shale play and, for example, mechanical behavior of the rock impacting the fracture treatment result. As an example, natural fractures may be open, or partially or totally filled, enabling or hindering flow.

Per trial results, permeability of stimulated fractures tended to be higher than in natural fractures found in a formation; however, one exception was found for the Barnett formation. A model suggests that, for the Barnett formation, in the vicinity of the hydraulic fractures there is damaged rather than stimulation. Such information, uncovered by such a model, may be valuable as it may help to detect possible problems related to hydraulic fracturing treatment design.

Figure 12:
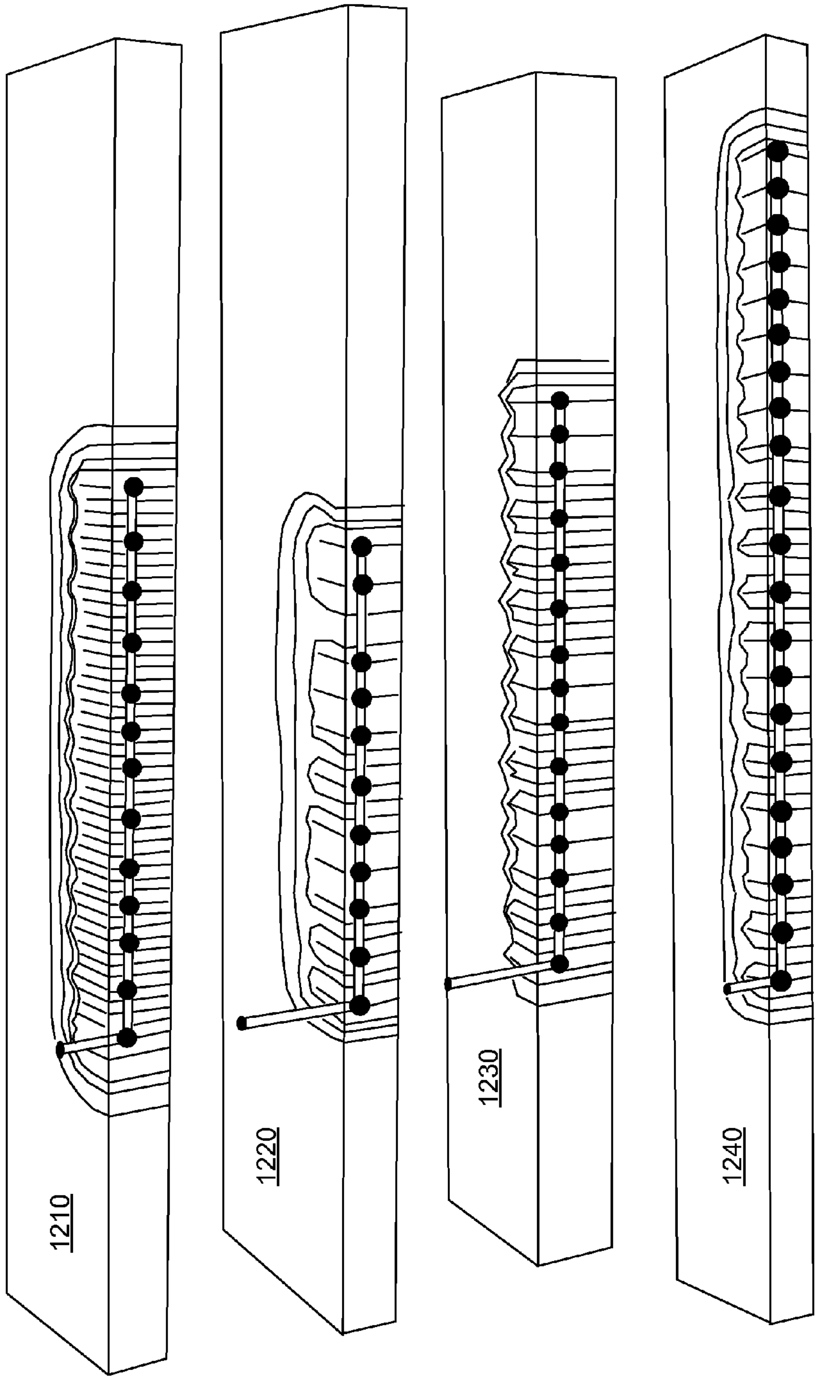
FIG. 12 illustrates examples simulation results.

FIG. 12 shows examples of simulation results 1200 for a model that was adapted to Haynesville formation data, to Barnett formation data, to Fayetteville formation data, and to Woodford formation data. Specifically, a plot 1210 shows simulation results for a Haynesville adapted model, a plot 1220 shows simulation results for a Barnett adapted model, a plot 1230 shows simulation results for a Fayetteville adapted model, and a plot 1240 shows simulation results for a Woodford adapted model. Contours in the plots 1210, 1220, 1230 and 1240 indicate pressure depletion for the drainage areas, each with a respective well. Various hydraulic fractures are also indicated as being modeled, for example, as filled circles along each wellbore. In the example of FIG. 12, the models included grid cells, for example, as shown with respect to the model of FIG. 4. The plots 1210, 1220, 1230 and 1240 may be considered cutaway views, for example, to illustrate pressures with respect to respective wellbores (e.g., to show pressure depletion in a vicinity of a wellbore). Such results (e.g., model output) may optionally be used in an algorithm, workflow, etc., for example, for planning stimulation treatment, setting one or more stimulation treatment control parameters, etc.

As an example, a method can include generating one or more synthetic models for application to an exploration project, for example, to predict future production. For example, consider a Silurian shale formation where, as input for application of one or more synthetic models, well landing depth, formation pressure, formation depth, top and layer thickness are provided. In such an example, operational parameters may be set according to values divined from a number of formations such as the Barnett, Fayetteville, Haynesville and Woodford formations. For example, consider a well length of about 3,600 ft, a well bore diameter of about 0.5833 ft, and a perforation interval spacing of about 150 feet (e.g., two shots per cluster).

As an example, four production forecast cases may be run by introducing the Silurian shale field data into calibrated shale formation model analogues (e.g., synthetic surrogate models). Referring again to the plot 542 of FIG. 5, it shows gas production analysis in each of these cases, where the most optimistic scenario is given by the Haynesville case, followed by the ones for Barnett, Woodford and Fayetteville, respectively. The results of this analysis are shown in Table 3, below. These results confirm the gas production scenarios.

TABLE 3

| Formation | Cumulative Gas Vol. |
|---|---|
| Haynesville | 65,522.55373 Mcf |
| Barnett | 37,236.83619 Mcf |
| Fayettevile | 35,260.06362 Mcf |
| Woodford | 37,172.69063 Mcf |

As an example, even with limited information, simulation models may be developed for that make it possible to have at least one production forecast per well in new shale gas exploration basins. Such an approach to forecasting production in shale gas exploration may be relatively robust from an engineering point of view, for example, represent a suitable way to address the uncertainty of shale gas project forecasting from the exploration stage.

As an example, a method can include providing data for at least one shale gas formation; performing a statistical analysis on the data for each shale gas formation; providing a simulation model; history matching the simulation model for each of the at least one different shale gas formations based at least in part on the performed statistical analyses to generate a history matched model for each of the at least one shale gas formations; and forecasting production for another shale gas formation by plugging in data for the other shale gas formation into each generated history matched model. In such an example, where data are provided for two or more shale gas formations, those shale gas formations may be different formations.

As an example, a statistical analysis may generate a set of production curves for a shale gas formation. In such an example, a method may include fitting curves to each of the production curves in a set of the set of production curves to generate sets of fit curves, for example, for each of at least one shale gas formations. As an example, one or more types of fit declines curve may be used that model decline of production, for example, via exponential decay, harmonic decay, hyperbolic decay, etc. As an example, such a method may include extrapolating each of the production curves in time using each of the fit curves (e.g., optionally by a year or more). As an example, a fitting process may fit more than one curve, type of curve, etc. to a production curve, for example, a method may use different curves at different times to represent diverse flowing periods (e.g., exhibited by a production curve).

As an example, a method may include performing history matching that adjusts parameter values of a simulation model for each set of fit curves (e.g., fit decline curves) to generate a history matched model for each of at least one shale gas formation. As an example, history matching may adjust parameter values of a simulation model for one fit curve from each set of fit curves to generate a history matched model for each of at least one shale gas formation. As an example, the one fit curve may be a fit curve for a respective Pave production curve. As an example, adjusting may be performed by an algorithm, for example, that acts to minimize error between target values (e.g., or a target curve) and model simulation values.

As an example, history matching may include adjusting parameter values for a model of formation that has produced hydrocarbons until output from the model approximates historic hydrocarbon production (e.g., and/or optionally other criteria) of the formation. As an example, historical production and pressures may be matched to within some tolerance. Accuracy of history matching may depend on, for example, quality of a model and quality and quantity of pressure and production data. As an example, once a model has been history matched, it may be used to simulate future behavior of the formation. As described with respect to various examples herein, one or more history matched models may be loaded with data for another formation, for example, to simulate behavior of that other formation. In such an example, data for the other formation may be limited, for example, due to one or more of various factors (e.g., exploration phase has not progressed to production, production is uncertain, etc.). As an example, one or more history matched models, as associated with one or more formations, may be used as one or more proxy or surrogate models for another, different formation.

As an example, a method may include performing a sensitivity analysis to assist with selection of parameters for history matching, for example, where the selection of parameters includes parameters to which production is sensitive. As an example, such a method may include ranking parameters and, for example, selecting at least one parameter based on the ranking (e.g., a parameter sensitivity ranking).

As an example, a model may model a matrix, natural fractures, hydraulic fractures and stimulated fractures. For example, a model may include parameters that may be set for a matrix portion of the model, a natural fracture portion of the model, a hydraulic fracture portion of the model and a stimulated fracture portion of the model. As an example, a model may model desorption of a hydrocarbon from organic matter in shale (e.g., include one or more desorption equations). As an example, a model may include at least one Langmuir parameter, for example, associated with a Langmuir isotherm for adsorbed gas on kerogen.

As an example, a method may include generating simulation results for a shale gas formation and controlling at least one piece of equipment based at least in part on the simulation results.

As an example, one or more computer-readable storage media can include computer-executable instructions to instruct a computing system to: access data for at least one shale gas formation; perform a statistical analysis on the data for each of the at least one shale gas formation; provide a simulation model; history match the simulation model for each of the at least one shale gas formation based at least in part on the performed statistical analysis for each of the at least one shale gas formation to generate a history matched model for each of the at least one shale gas formation; and forecast production for another shale gas formation by plugging in data for the other shale gas formation into each generated history matched model. As an example, instructions may be included to generate simulation results for the other shale gas formation and to control at least one piece of equipment based at least in part on the simulation results.

As an example, a statistical analysis may generate a set of production curves for each of at least one shale gas formation and instructions may be provided to fit curves to each of the production curves in each set of production curves to generate sets of fit curves for each of the at least one shale gas formation. As an example, fit curves may include at least one of an exponential curve, a hyperbolic curve and a harmonic curve. For example, given a set of production curves such as P10, a Pave and a P90, a fitting process may fit each with an exponential decline curve, a hyperbolic decline curve and a harmonic decline curve to generate a total of nine fit decline curves (e.g., three for each production curve). In such an example, where data are provided for two shale gas formations, as an example, a total of eighteen fit decline curves may be generated. From such fit decline curves, one or more may be selected for further analysis, processing, etc. As an example, one or more decline curves may be used to fit a production curve with respect to time. For example, a mixed approach may include a hyperbolic decline curve followed in time by an exponential decline curve. The resulting fit decline curve from a mixed approach may be, for example, extrapolated in time (e.g., using an exponential tail portion that extends from a hyperbolic head portion).

As an example, a system can include one or more processors; memory; and instructions stored in the memory and executable by at least one of the one or more processors to instruct the system to access data for at least one formation that has produced hydrocarbons; perform a statistical analysis on the data; provide a model; history match the model for each of the at least one formation based at least in part on the performed statistical analysis to generate a history matched model for each of the at least one formation; and forecast production of hydrocarbons for another formation by plugging in data for the other formation into each generated history matched model. In such an example, a formation may be or include a shale gas formation. As an example, instructions may be provided to instruct a system to provide a model that can model a matrix, natural fractures, hydraulic fractures and stimulated fractures. As an example, a model may model a drainage area as including a matrix, one or more natural fractures, one or more hydraulic fractures and optionally one or more stimulated fractures.

Figure 13:
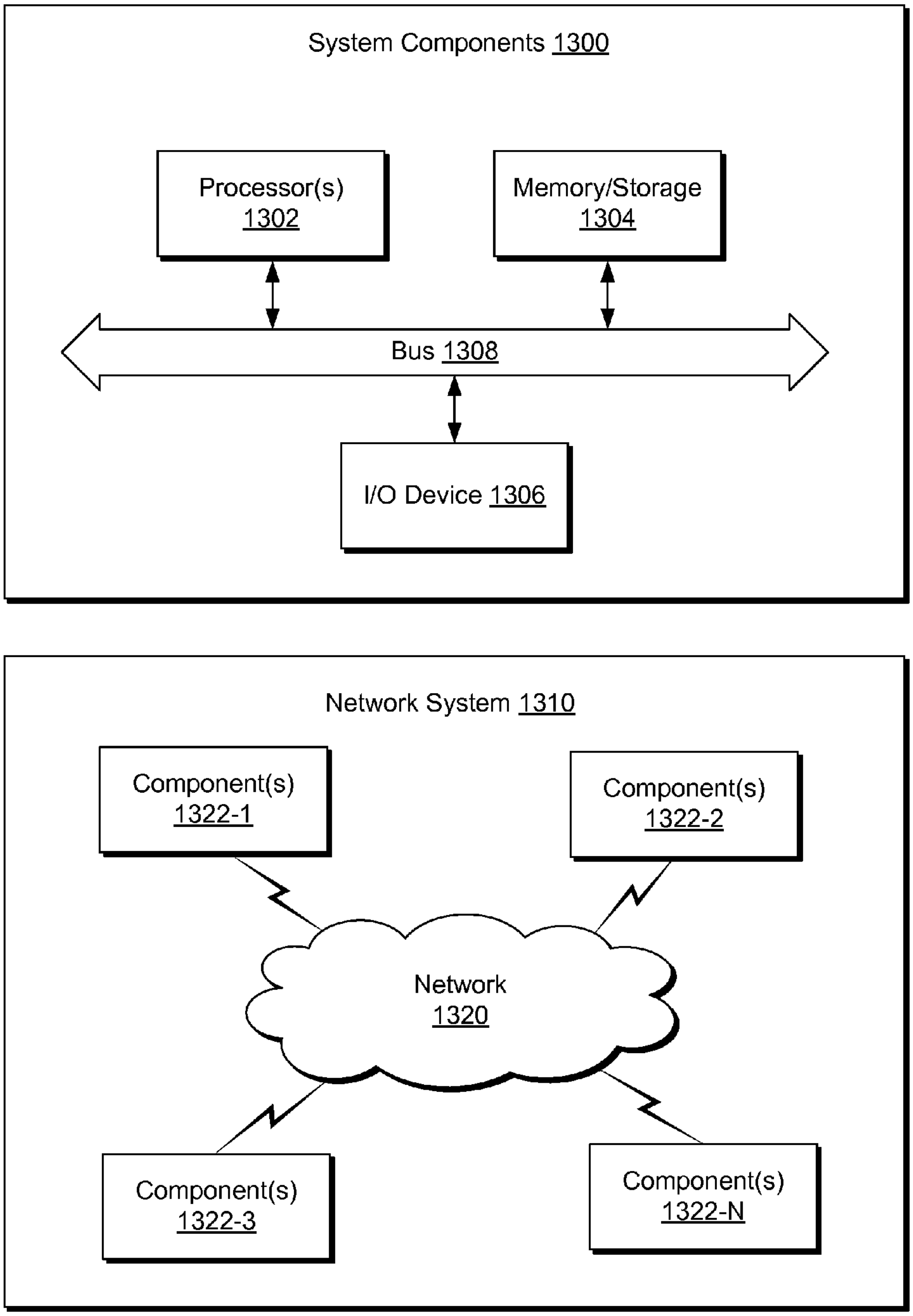
FIG. 13 illustrates example components of a system and a networked system.

FIG. 13 shows components of an example of a computing system 1300 and an example of a networked system 1310. The system 1300 includes one or more processors 1302, memory and/or storage components 1304, one or more input and/or output devices 1306 and a bus 1308. In an example embodiment, instructions may be stored in one or more computer-readable media (e.g., memory/storage components 1304). Such instructions may be read by one or more processors (e.g., the processor(s) 1302) via a communication bus (e.g., the bus 1308), which may be wired or wireless. The one or more processors may execute such instructions to implement (wholly or in part) one or more attributes (e.g., as part of a method). A user may view output from and interact with a process via an I/O device (e.g., the device 1306). In an example embodiment, a computer-readable medium may be a storage component such as a physical memory storage device, for example, a chip, a chip on a package, a memory card, etc. (e.g., a computer-readable storage medium).

In an example embodiment, components may be distributed, such as in the network system 1310. The network system 1310 includes components 1322-1, 1322-2, 1322-3, . . . 1322-N. For example, the components 1322-1 may include the processor(s) 1302 while the component(s) 1322-3 may include memory accessible by the processor(s) 1302. Further, the component(s) 1302-2 may include an I/O device for display and optionally interaction with a method. The network may be or include the Internet, an intranet, a cellular network, a satellite network, etc.

As an example, a device may be a mobile device that includes one or more network interfaces for communication of information. For example, a mobile device may include a wireless network interface (e.g., operable via IEEE 802.11, ETSI GSM, BLUETOOTH®, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

As an example, information may be input from a display (e.g., consider a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

Although only a few example embodiments have been described in detail above, those skilled in the art will readily appreciate that many modifications are possible in the example embodiments. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words "means for" together with an associated function.

What is claimed is:

1. A method comprising:

providing data for shale gas formations;

performing a statistical analysis on the data for each of the shale gas formations;

providing a simulation model; history matching the simulation model for each of the shale gas formations based at least in part on the performed statistical analysis to generate a history matched model for each of the shale gas formations wherein the history matching comprises performing a sensitivity analysis to assist with selection of parameters for history matching wherein the selection of parameters comprises selecting parameters to which production of a corresponding shale gas formation is sensitive based at least in part on a parameter sensitivity ranking;

forecasting production for another shale gas formation by plugging in data for the other shale gas formation into each generated history matched model to generate results for the other shale gas formation from each of the generated history matched models; and controlling at least one piece of equipment based at least in part on the results.

2. The method of claim 1 wherein the statistical analysis generates a set of production curves for each of the shale gas formations.

3. The method of claim 2 comprising fitting a decline curve to each of the production curves in each set of production curves to generate a set of fit decline curves for each of the shale gas formations.

4. The method of claim 3 comprising extrapolating each of the production curves in time using each of the fit decline curves.

5. The method of claim 4 wherein the extrapolating extrapolates the production curves by at least a year.

6. The method of claim 3 wherein the history matching adjusts parameter values of the simulation model for each set of the fit decline curves to generate the history matched model for each of the shale gas formations.

7. The method of claim 3 wherein the history matching adjusts parameter values of the simulation model for one fit decline curve from each set of the fit decline curves to generate the history matched model for each of the shale gas formations.

8. The method of claim 7 wherein the one fit decline curve comprises a fit decline curve for a respective Pave production curve that is an average pressure production curve.

9. The method of claim 1 wherein the simulation model models a matrix, natural fractures, hydraulic fractures and stimulated fractures.

10. The method of claim 1 wherein the simulation model models desorption of a hydrocarbon from organic matter in shale.

11. The method of claim 10 wherein the simulation model comprises at least one Langmuir parameter associated with a Langmuir isotherm for adsorbed gas on kerogen.

12. One or more non-transitory computer-readable storage media comprising computer-executable instructions to instruct a computing system to:

access data for shale gas formations; perform a statistical analysis on the data for each of the shale gas formations;

provide a simulation model;

history match the simulation model for each of the shale gas formations based at least in part on the performed statistical analysis to generate a history matched model for each of the shale gas formations wherein the history match performs a sensitivity analysis to assist with selection of parameters for history matching wherein the selection of parameters comprises selects parameters to which production of a corresponding shale gas formation is sensitive based at least in part on a parameter sensitivity ranking;

forecast production for another shale gas formation by plugging in data for the other shale gas formation into each generated history matched model to generate results for the other shale gas formation from each of the generated history matched models; and control at least one piece of equipment based at least in part on the results.

13. The one or more non-transitory computer-readable storage media of claim 12 wherein the statistical analysis generates a set of production curves for each of the shale gas formations and comprising instructions to fit decline curves to each of the production curves in each set of production curves to generate a set of fit decline curves for each of the shale gas formations.

14. The one or more non-transitory computer-readable storage media of claim 13 wherein the fit decline curves comprise at least one member selected from a group consisting of an exponential decline curve, a hyperbolic decline curve and a harmonic decline curve.

15. A system comprising:

one or more processors;

memory; and instructions stored in the memory and executable by at least one of the one or more processors to instruct the system to access data for formations that have produced hydrocarbons; perform a statistical analysis on the data for each of the formations;

provide a model;

history match the model for each of the formations based at least in part on the performed statistical analysis to generate a history matched model for each of the formations, wherein the history match performs a sensitivity analysis to assist with selection of parameters for history matching wherein the selection of parameters comprises selects parameters to which production of a corresponding shale gas formation is sensitive based at least in part on a parameter sensitivity ranking;

forecast production of hydrocarbons for another formation by plugging in data for the other formation into each generated history matched model to generate results for the other shale gas formation from each of the generated history matched models; and control at least one piece of equipment based at least in part on the results.

16. The system of claim 15 wherein at least one of the formations comprises a shale gas formation.

17. The system of claim 15 wherein the instructions comprises instructions to instruct the system to provide a model that models a matrix, natural fractures, hydraulic fractures and stimulated fractures.

18. The method of claim 1 wherein the parameters comprise reservoir parameters and operational/controlled parameters.

* * * * *